United States Patent
Ueda et al.

(10) Patent No.: US 9,112,039 B2
(45) Date of Patent: Aug. 18, 2015

(54) FIELD-EFFECT TRANSISTOR, DISPLAY ELEMENT, IMAGE DISPLAY DEVICE, AND SYSTEM

(71) Applicants: Naoyuki Ueda, Kanagawa (JP); Yuki Nakamura, Tokyo (JP); Shinji Matsumoto, Kanagawa (JP); Yuji Sone, Kanagawa (JP); Mikiko Takada, Kanagawa (JP); Ryoichi Saotome, Kanagawa (JP); Sadanori Arae, Kanagawa (JP); Yukiko Abe, Kanagawa (JP)

(72) Inventors: Naoyuki Ueda, Kanagawa (JP); Yuki Nakamura, Tokyo (JP); Shinji Matsumoto, Kanagawa (JP); Yuji Sone, Kanagawa (JP); Mikiko Takada, Kanagawa (JP); Ryoichi Saotome, Kanagawa (JP); Sadanori Arae, Kanagawa (JP); Yukiko Abe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/312,950

(22) Filed: Jun. 24, 2014

(65) Prior Publication Data
US 2015/0001531 A1    Jan. 1, 2015

(30) Foreign Application Priority Data

Jun. 28, 2013   (JP) ................................ 2013-136422
May 2, 2014    (JP) ................................ 2014-095182

(51) Int. Cl.
| H01L 29/10 | (2006.01) |
| H01L 29/786 | (2006.01) |
| H01L 27/12 | (2006.01) |
| H01L 29/04 | (2006.01) |
| H01L 29/24 | (2006.01) |

(52) U.S. Cl.
CPC ........ *H01L 29/7869* (2013.01); *H01L 27/1225* (2013.01); *H01L 27/1229* (2013.01); *H01L 29/04* (2013.01); *H01L 29/24* (2013.01)

(58) Field of Classification Search
CPC .. H01L 29/24; H01L 27/3244; H01L 27/3241
See application file for complete search history.

(56) References Cited

U.S. PATENT DOCUMENTS

| 2011/0050733 A1 | 3/2011 | Yano et al. |
| 2012/0306834 A1 | 12/2012 | Ueda et al. |

(Continued)

FOREIGN PATENT DOCUMENTS

| JP | 2002-076356 | 3/2002 |
| JP | 2006-165529 | 6/2006 |

(Continued)

OTHER PUBLICATIONS

K. Nomura and five others, Room-temperature fabrication of transparent flexible thin-film transistors using amorphous oxide semiconductors, Nature, vol. 432, No. 25, Nov. 2004, pp. 488-492.

(Continued)

*Primary Examiner* — Elias M Ullah
(74) *Attorney, Agent, or Firm* — Cooper & Dunham LLP

(57) ABSTRACT

A field-effect transistor, which contains: a gate electrode configured to apply gate voltage; a source electrode and a drain electrode, which are configured to extract electric current; an active layer formed of a n-type oxide semiconductor, provided in contact with the source electrode and the drain electrode; and a gate insulating layer provided between the gate electrode and the active layer, wherein the n-type oxide semiconductor is a triclinic crystal compound, a monoclinic crystal compound, or a trigonal crystal compound, each of which is substitutionally doped with at least one dopant selected from the group consisting of a divalent cation, a trivalent cation, a tetravalent cation, a pentavalent cation, and a hexavalent cation, and wherein a valence of the dopant is greater than a valence of a metal ion constituting the n-type oxide semiconductor, excluding the dopant.

15 Claims, 14 Drawing Sheets

(56) References Cited

U.S. PATENT DOCUMENTS

2013/0134413 A1    5/2013    Yamazaki et al.
2014/0217469 A1    8/2014    Sasaki et al.

FOREIGN PATENT DOCUMENTS

| | | |
|---|---|---|
| JP | 2011-192971 | 9/2011 |
| WO | WO2008/096768 | 8/2008 |
| WO | WO 2013/035842 A1 | 3/2013 |
| WO | WO 2013/069471 A1 | 5/2013 |

OTHER PUBLICATIONS

J. S. Park, five others, Novel ZrInZnO Thin-film Transistor with Excellent Stability, Advanced Materials, vol. 21, No. 3, 2009, pp. 329-333.

European Search Report dated Oct. 17, 2014 in corresponding European patent application No. 14 17 3930.0.

FIELD-EFFECT TRANSISTOR, DISPLAY ELEMENT, IMAGE DISPLAY DEVICE, AND SYSTEM

BACKGROUND OF THE INVENTION

1. Field of the Invention

The present invention relates to a field-effect transistor, a display element, an image display device, and a system. Specifically, the present invention relates to a field-effect transistor containing an active layer composed of oxide semiconductor, a display element and an image display device each containing the field-effect transistor, and a system equipped with the image display device.

2. Description of the Related Art

A field-effect transistor (FET) is a transistor which controls electric current passed between a source electrode and a drain electrode by voltage is applied to a gate electrode to provide a gate for a flow of electrons or holes with applying an electric field to a channel.

The FET has been used as a switching element or an amplifying element, because of properties thereof. Since an FET shows a small gate current and has a flat profile, it can be easily manufactured or integrated compared to a bipolar transistor. For these reasons, the FET is an indispensable element used in many of integrated circuits of current electric devices.

The FET is applied in an active matrix display as a thin film transistor (TFT).

In recent years, liquid crystal displays, organic EL (electroluminescent) displays, electronic paper, and the like have been made into practical use as flat panel displays (FPDs).

These FPDs are driven by a driving circuit containing TFT using amorphous silicon or polycrystalline silicon in an active layer. There are demands for the FPD to be increased in the size, resolution, and driving speed thereof. Along with these demands, TFTs are required to have higher carrier mobility, less characteristic change over time, and less inter-element characteristic variations in a panel.

However, TFTs using amorphous silicon (a-Si) or polycrystalline silicon (particularly, low temperature polysilicon: LTPS) for an active layer have advantages and disadvantages. Therefore, it has been difficult to achieve all of the requirements at the same time.

For example, the a-Si TFT has disadvantages that the mobility thereof is insufficient to drive a large-screen liquid crystal display (LCD) at high speed, and that a large shift of the threshold voltage occurs when being continuously driven. The LTPS-TFT has large mobility, but has problems that variations in threshold voltage is large, as an active layer is crystallized by excimer laser annealing, and a mother glass size of a production line cannot be made large.

Therefore, there is a need for a novel TFT technology, which has both an advantage of a-Si TFT and an advantage of LTPS-TFT. In order to meet this need, development of TFT using an oxide semiconductor, to which carrier mobility superior to that of a-Si can be expected, has been recently actively carried out.

Particularly, $InGaZnO_4$ (a-IGZO), which can be formed into a film at room temperature, and exhibits greater mobility in the amorphous state than that of a-Si, is disclosed (see, K. Nomura and five others, Room-temperature fabrication of transparent flexible thin-film transistors using amorphous oxide semiconductors, NATURE, VOL. 432, No. 25, NOVEMBER, 2004, pp. 488-492). Since this disclosure, numerous researches on an amorphous oxide semiconductor having high mobility have been actively conducted.

However, an oxygen concentration of the aforementioned oxide semiconductor needs to be precisely controlled during a film forming process, as carrier electrons are generated by oxygen vacancy. If it is attempted to realize high mobility, the oxide semiconductor tends to be in a depression state, and a process window for realizing normally-off is extremely narrow. Moreover, the oxygen concentration in the film is changed by patterning or passivation process after forming the oxide semiconductor film, and therefore the properties thereof tend to be deteriorated.

In order to solve the aforementioned problems, a countermeasure has been conventionally studied based on two viewpoints. The first viewpoint is to compensate carriers generated by oxygen vacancy with introduction of a p-type dopant (e.g., substituting $In^{3+}$ with $Zn^{2+}$) to thereby maintain the carrier concentration low (see Japanese Patent Application Laid-Open (JP-A) Nos. 2002-76356 and 2006-165529). In association with this method, it is also attempted to add a small amount of counter cations to stabilize the p-type dopant (for example, substituting $In^{3+}$ with $Zn^{2+}$, and adding a trace amount of $Sn^{4+}$ ($[Zn^{2+}]>[Sn^{4+}]$)) (see International Publication No. WO2008-096768). The other is a method, in which a certain amount of a metal element (e.g., Al, Zr, and H) having high affinity to oxygen is introduced to prevent generation of carriers (see, J. S. Park, five others, Novel ZrInZnO Thin-film Transistor with Excellent Stability, Advanced Materials, VOL. 21, No. 3, 2009, pp. 329-333).

However, all of the methods had a problem, such as insufficient stability, and low mobility.

SUMMARY OF THE INVENTION

The present invention aims to solve the various problems in the art and to achieve the following object. Specifically, an object of the present invention is to generate carriers through n-type substitutional doping in an oxide semiconductor of an active layer of a field-effect transistor, introducing a sufficient amount of oxygen during formation of a film to eliminate precise control of an oxygen concentration, and reduce oxygen vacancy to enhance stability of lattice to thereby realize stability of properties in a later step.

The means for solving the aforementioned problems is as follows:

The field-effect transistor of the present invention contains:
a gate electrode configured to apply gate voltage;
a source electrode and a drain electrode, which are configured to extract electric current;
an active layer formed of a n-type oxide semiconductor, provided in contact with the source electrode and the drain electrode; and
a gate insulating layer provided between the gate electrode and the active layer,
wherein the n-type oxide semiconductor is a triclinic crystal compound, a monoclinic crystal compound, or a trigonal crystal compound, each of which is substitutionally doped with at least one dopant selected from the group consisting of a divalent cation, a trivalent cation, a tetravalent cation, a pentavalent cation, and a hexavalent cation, and
wherein a valence of the dopant is greater than a valence of a metal ion constituting the n-type oxide semiconductor, excluding the dopant.

The present invention can solve the aforementioned various problems in the art. According to the present invention, moreover, electron carriers are generated by performing n-type substitutional doping on a n-type oxide semiconductor, which is an active layer of a field-effect transistor, a precise control of an oxygen concentration is eliminated by introducing a sufficient amount oxygen during formation of a film, a process margin is increased as well as enhancing stability of lattice through reduction of oxygen vacancy, and therefore stability in properties thereof can be realized in a later step. Therefore, it is possible to reduce variations among elements, and a high quality field-effect transistor, which can be used for realizing high precise image display of a large area.

Figure 1:
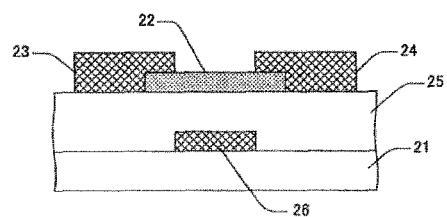
FIG. 1 is a schematic configuration diagram illustrating one example of a top contact/bottom gate field-effect transistor.

DETAILED DESCRIPTION OF THE INVENTION (Field-Effect Transistor)

The field-effect transistor of the present invention contains at least a gate electrode, a source electrode, a drain electrode, an active layer, and a gate insulating layer, and may further contain other members.
<Gate Electrode>

The gate electrode is appropriately selected depending on the intended purpose without any limitation, provided that it is an electrode for applying gate voltage.

A material of the gate electrode is appropriately selected depending on the intended purpose without any limitation, and examples thereof include a metal (e.g., Mo, Al, Ag, and Cu) an alloy thereof, transparent electroconductive oxide (e.g., ITO, and ATO), and an organic electroconductor (e.g., polyethylenedioxythiopnene (PEDOT), and polyaniline (PANI)).

A formation method of the gate electrode is appropriately selected depending on the intended purpose without any limitation, and examples thereof include: (i) a method where a film is formed by sputtering or dip coating, followed by patterning the film through photolithography; and (ii) a method where a film of the predetermined shape is directly formed through printing process, such as inkjet printing, nanoimprint lithography, and gravure printing.

The average thickness of the gate electrode is appropriately selected depending on the intended purpose without any limitation, but the thickness thereof is preferably 20 nm to 1 μm, more preferably 50 nm to 300 nm.
<Source Electrode and Drain Electrode>

The source electrode and the drain electrode are appropriately selected depending on the intended purpose without any limitation, provided that they are electrode to extract electric current.

A material of the source electrode and the drain electrode is appropriately selected depending on the intended purpose without any limitation, and examples thereof include the same materials to those listed in the explanation of the gate electrode.

A formation method of the source electrode and drain electrode is appropriately selected depending on the intended purpose without any limitation, and examples thereof include the same methods to those listed in the explanation of the gate electrode.

The average thickness of each of the source electrode and the drain electrode is appropriately selected depending on the intended purpose without any limitation, but the average thickness thereof is preferably 20 nm to 1 μm, more preferably 50 nm to 300 nm.
<Active Layer>

The active layer is a layer provided in contact with the source electrode and the drain electrode.

In the previous research conducted by the present inventors, it was disclosed that electron carriers are generated in a highly symmetric oxide semiconductor by n-type doping (see JP-A No. 2011-192971), but it was not necessarily clear that n-type doping effectively functioned in a low symmetric oxide semiconductor, such as those mentioned below. However, the present inventors have found an effective combination of an n-type dopant and an oxide semiconductor, even through the oxide semiconductor has low symmetry as described below.

A material of the active layer is a n-type oxide semiconductor, which is a triclinic crystal compound, a monoclinic crystal compound, or a trigonal crystal compound, which is substitutionally doped with at least one dopant selected from the group consisting of divalent cation, trivalent cation, tetravalent cation, pentavalent cation, and hexavalent cation.

The valence of the dopant is greater than the valence of a metal ion (provided that the dopant is excluded) constituting the n-type oxide semiconductor.

Note that, the substitutional doping is also referred to as n-type doping.
<<Triclinic Crystal Compound>>

A first candidate of the active layer in the present invention is a n-type oxide semiconductor, and is a triclinic crystal compound, which is substitutionally doped with at least one dopant selected from the group consisting of a divalent cation, a trivalent cation, a tetravalent cation, a pentavalent cation, and a hexavalent cation.

The triclinic crystal compound preferably belongs to the point group $C_1$ or $C_i$.

The triclinic crystal compound preferably belongs to the space group No. 1 or No. 2.

The triclinic crystal compound preferably contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

The substitutional doping is preferably performed by introduction of a cation of at least one selected from the group consisting of Mg, Ca, Sr, Ba, Zn, Cd, Hg, Al, Ga. In, Tl, Ge, Sn, Pb, Ti, Zr, Hf, Ce, V, Nb, Ta, As, Sb, Bi, Mo, W, and Te.

Suitable examples thereof include $Cu_2WO_4$. $Cd_2Ge_3O_8$, and $HgTeO_3$. Alternatively, solid solutions thereof may be used. Here, the composition is represented with integers, but unexpected nonstoichiometry or inclusion of a trace amount of impurities is allowed as long as the below-mentioned doping is adversely affected. Especially, oxygen vacany tends to be formed, and the oxygen in the composition is typically smaller than the value presented in the rational formula.

As for the substitutional doping, which is n-type doping, a dopant having a larger valence, for example, divalent $Mg^{2+}$, $Ca^{2+}$, $Sr^{2+}$, $Ba^{2+}$, $Zn^{2+}$, $Cd^{2+}$, or $Hg^{2+}$, trivalent $Al^{3+}$, $Ga^{3+}$, $In^{3+}$, $Tl^{3+}$, $Ya^{3+}$, or $La^{3+}$, tetravalent $Ge^{4+}$, $Sn^{4+}$, $Pb^{4+}$, $Ti^{4+}$, $Zr^{4+}$, $Hf^{4+}$, or $Ce^{4+}$, pentavalent $V^{5+}$, $Nb^{5+}$, $Ta^{5+}$, $As^{5+}$, $Sb^{5+}$, or $Bi^{5+}$, or hexavalent $Mo^{6+}$, $We^{6+}$, or $Te^{6+}$ can be used for $Cu^+$ that is a monovalent cation. Alternatively, a plurality of them may be used for doping.

As for the substitutional doping, which is n-type doping, a dopant having a larger valence, for example, trivalent $Al^{3+}$, $Ga^{3+}$, $In^{3+}$, $Tl^{3+}$, $Y^{3+}$, or $La^{3+}$, tetravalent $Ge^{4+}$, $Sn^{4+}$, $Pb^{4+}$, $Ti^{4+}$, $Zr^{4+}$, $Hf^{4+}$, or $Ce^{4+}$, pentavalent $V^{5+}$, $Nb^{5+}$, $Ta^{5+}$, $As^{5+}$, $Sb^{5+}$, or $Bi^{5+}$, or hexavalent $Mo^{6+}$, $W^{6+}$, or $Te^{6+}$ can be used for a divalent cation, such as $Cd^{2+}$, and $Hg^{2+}$. Alternatively, a plurality of them may be used for doping.

As for the substitutional doping, which is n-type doping, a dopant having a larger valence, for example, pentavalent $V^{5+}$, $Nb^{5+}$, $Ta^{5+}$, $As^{5+}$, $Sb^{5+}$, or $Bi^{5+}$, or hexavalent $Mo^{6+}$, $W^{6+}$, or $Te^{6+}$ can be used for a tetravalent cation, such as $Ge^{4+}$, $Te^{4+}$. Alternatively, a plurality of them may be used for doping.

The dopant is preferably selected considering a diameter of an ion, coordination number, and orbital energy. The doping concentration is appropriately selected depending on a material of a host phase, a species of a dopant or a site to be substituted, a film forming process, and desired TFT properties. In the case where a Zn-doped $Cu_2WO_4$ film is prepared by sputtering, for example, a target which is doped with Zn in an amount of about 1% can be prepared. Since Zn substituting the Cu site forms a donor, formation of oxygen vacancy can be reduced by increasing an oxygen concentration of sputtering gas compared to that used in preparation of nondoped $Cu_2WO_4$. In this case, moreover, contact resistance with the source and drain electrodes can be controlled low with maintaining a carrier concentration, and therefore decrease of mobility can be prevented. In the sputtering process, moreover, the material goes through a highly excited state, and therefore carriers can be generated without heating a substrate.

In the case where the oxide has a rigid structure even if a diffraction line is not observed through X-ray diffraction (XRD) and no long distance order is present (typically it is called an amorphous state), oxygen coordination polyhedra (e.g., $CdO_6$ octahedron) and the linking form thereof (e.g., a chain of edge sharing $CdO_6$) are maintained, and therefore substitutional doping can be effectively affected. In the aforementioned structure, the density of states originated from tail states unique to amorphous state is small, sub-gap absorption is small, and an optical degradation characteristic is superior to that of a material having a highly amorphous characteristic. On the other hand, doping is obviously effective, if the oxide is in a crystal state, and a grain boundary effect is small in the conduction band composed of 4s, 5s, or 6s bands of heavy-metal ions. In the case where a doping amount is excessively large, and segregation of a dopant is observed at a grain boundary, however, it is preferable to lower the dopant concentration. Moreover, it is preferred that post annealing be performed at 200° C. to 300° C. in order to improve adhesiveness and electric connection at the interface between the source-drain electrodes and the active layer. Moreover, annealing may be performed at higher temperature to enhance crystallinity.

<<Monoclinic Crystal Compound>>

A second candidate of the active layer in the present invention is a n-type oxide semiconductor, and is a monoclinic crystal compound, which is substitutionally doped with at least one dopant selected from the group consisting of a divalent cation, a trivalent cation, a tetravalent cation, a pentavalent cation, and a hexavalent cation.

The monoclinic crystal compound preferably belongs to the point group $C_2$, $C_s$, or $C_{2h}$.

The monoclinic crystal compound preferably belongs to any of the space group Nos. 3 to 15.

The monoclinic crystal compound preferably contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

The substitutional doping is preferably performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.

Suitable examples thereof include $SrGa_2O_4$, $BaIn_2O_4$, $Zn_2Ge_2O_6$, and $Cd_2Ge_2O_6$. Alternatively, solid solutions thereof may be used. Here, the composition is represented with integers, but unexpected nonstoichiometry or inclusion of a trace amount of impurities is allowed as long as the below-mentioned doping is adversely affected. Especially, oxygen defects tend to be formed, and the oxygen in the composition is typically smaller than the value presented in the rational formula.

As for the substitutional doping, which is n-type doping, a dopant having a larger valence, for example, trivalent $Al^{3+}$, $Ga^{3+}$, $In^{3+}$, $Tl^{3+}$, $Y^{3+}$, or $La^{3+}$, tetravalent $Ge^{4+}$, $Sn^{4+}$, $Pb^{4+}$, $Ti^{4+}$, $Zr^{4+}$, $Hf^{4+}$, or $Ce^{4+}$, pentavalent $V^{5+}$, $Nb^{5+}$, $Ta^{5+}$, $As^{5+}$, $Sb^{5+}$, or $Bi^{5+}$, or hexavalent $Mo^{6+}$, $W^{6+}$, or $Te^{6+}$ can be used for a divalent cation, such as $Sr^{2+}$, $Ba^{2+}$, $Zn^{2+}$, and $Cd^{2+}$. Alternatively, a plurality of them may be used for doping.

As for the substitutional doping, which is n-type doping, a dopant having a larger valence, for example, tetravalent $Ge^{4+}$, $Sn^{4+}$, $Pb^{4+}$, $Ti^{4+}$, $Zr^{4+}$, $Hf^{4+}$, or $Ce^{4+}$, pentavalent $V^{5+}$, $Nb^{5+}$, $Ta^{5+}$, $As^{5+}$, $Sb^{5+}$, or $Bi^{5+}$, or hexavalent $Mo^{6+}$, $W^{6+}$, or $Te^{6+}$ can be used for a trivalent cation, such as $Ga^{3+}$, and $In^{3+}$. Alternatively, a plurality of them may be used for doping.

As for the substitutional doping, which is n-type doping, a dopant having a larger valence, for example, pentavalent $V^{5+}$, $Nb^{6+}$, $Ta^{5+}$, $As^{5+}$, $Sb^{5+}$, or $Bi^{5+}$, or hexavalent $Mo^{5+}$, $W^{6+}$, or $Te^{6+}$ can be used for a tetravalent cation, such as $Ge^{4+}$. Alternatively, a plurality of them may be used for doping.

The dopant is preferably selected considering an ionic radius, coordination number, and orbital energy. The doping concentration is appropriately selected depending on a material of a host phase, a species of a dopant or a site to be substituted, a film forming process, and desired TFT properties. In the case where a W-doped $BaIn_2O_4$ film is prepared by sputtering, for example, a target which is doped with W in an amount of about 0.5% can be prepared. Since W substituting the In site forms a donor, formation of oxygen vacancy can be reduced by increasing an oxygen concentration of sputtering gas compared to that used in preparation of nondoped $BaIn_2O_4$. In this case, moreover, contact resistance with the source and drain electrodes can be controlled low with maintaining a carrier concentration, and therefore decrease of mobility can be prevented. In the sputtering process, moreover, the material goes through a highly excited state, and therefore carriers can be generated without heating a substrate.

In the case where the oxide has a rigid structure even if a diffraction line is not observed through X-ray diffraction (XRD) and no long distance order is present (typically it is called an amorphous state), oxygen coordination polyhedra (e.g., $GaO_6$ octahedron, and $InO_6$ octahedron) and the linking form thereof (e.g., a chain of edge or plane sharing $InO_6$) are maintained, and therefore substitutional doping can be effectively affected. In the aforementioned structure, the density of states originated from tail states unique to amorphous states is small, sub-gap absorption is small, and an optical degration characteristic is superior to that of a material having a highly amorphous characteristic. On the other hand, doping is obviously effective, if the oxide is in a crystal state, and a grain boundary effect is small in the conduction band composed of 4s, 5s, or 6s bands of heavy-metal ions. In the case where a doping amount is excessively large, and segregation of a dopant is observed at a grain boundary, however, it is preferable to lower the dopant concentration. Moreover, it is preferred that post annealing be performed at 200° C. to 300° C. in order to improve adhesiveness and electric connection at the interface between the source-drain electrodes and the active layer. Moreover, annealing may be performed at higher temperature to enhance crystallinity.

<<Trigonal Crystal Compound>>

A third candidate of the active layer in the present invention is a n-type oxide semiconductor, and is a trigonal crystal compound, which is substitutionally doped with at least one dopant selected from the group consisting of a divalent cation, a trivalent cation, a tetravalent cation, a pentavalent cation, and a hexavalent cation.

The trigonal crystal compound preferably belongs to the point group $C_3$, $C_{3i}$, $D_3$, $C_{3v}$, or $D_{3d}$.

The trigonal crystal compound preferably belongs to any of the space group Nos. 143 to 167.

The trigonal crystal compound preferably contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

The substitutional doping is preferably performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.

Suitable examples thereof include $ZnTiO_3$, $Zn_2GeO_4$, $In_2Zn_3O_6$, $Ba_3W_2O_9$, and $Tl_2TeO_6$. Alternatively, solid solutions thereof may be used. Here, the composition is represented with integers, but unexpected nonstoichiometry or inclusion of a trace amount of impurities is allowed as long as the below-mentioned doping is adversely affected. Especially, oxygen vacancy tends to be formed, and the oxygen in the composition is typically smaller than the value presented in the rational formula.

As for the substitutional doping, which is n-type doping, a dopant having a larger valence, for example, trivalent $Al^{3+}$, $Ga^{3+}$, $In^{3+}$, $Tl^{3+}$, $Y^{3+}$, or $La^{3+}$, tetravalent $Ge^{4+}$, $Sn^{4+}$, $Pb^{4+}$, $Ti^{4+}$, $Zr^{4+}$, $Hf^{4+}$, or $Ce^{4+}$, pentavalent $V^{5+}$, $Nb^{5+}$, $Ta^{5+}$, $As^{5+}$, $Sb^{5+}$, or $Bi^{5+}$, or hexavalent $Mo^{6+}$, $W^{6+}$, or $Te^{6+}$ can be used for a divalent cation, such as $Ba^{2+}$, and $Zn^{2+}$. Alternatively, a plurality of them may be used for doping.

As for the substitutional doping, which is n-type doping, a dopant having a larger valence, for example, tetravalent $Ge^{4+}$, $Sn^{4+}$, $Pb^{4+}$, $Ti^{4+}$, $Zr^{4+}$, $Hf^{4+}$, or $Ce^{4+}$, pentavalent $V^{5+}$, $Nb^{5+}$, $Ta^{5+}$, $As^{5+}$, $Sb^{5+}$, or $Bi^{5+}$, or hexavalent $Mo^{6+}$, $W^{6+}$, or $Te^{6+}$ can be used for a trivalent cation, such as $In^{3+}$, and $Tl^{3+}$. Alternatively, a plurality of them may be used for doping.

As for the substitutional doping, which is n-type doping, a dopant having a larger valence, for example, pentavalent $V^{5+}$, $Nb^{5+}$, $Ta^{5+}$, $As^{5+}$, $Sb^{5+}$, or $Bi^{5+}$, or hexavalent $Mo^{6+}$, $W^{6+}$, or $Te^{6+}$ can be used for a tetravalent cation, such as $Ge^{4+}$, and $Ti^{4+}$. Alternatively, a plurality of them may be used for doping.

The dopant is preferably selected considering a diameter of an ion, coordination number, and orbital energy. The doping concentration is appropriately selected depending on a material of a host phase, a species of a dopant or a site to be substituted, a film forming process, and desired TFT properties. In the case where an Nb-doped $ZnTiO_3$ film is prepared by sputtering, for example, a target which is doped with Nb in an amount of about 1% can be prepared. Since Nb substituting the Ti site forms a donor, formation of oxygen vacancy can be reduced by increasing an oxygen concentration of sputtering gas compared to that used in preparation of non-doped $ZnTiO_3$. In this case, moreover, contact resistance with the source and drain electrodes can be controlled low with maintaining a carrier concentration, and therefore decrease of mobility can be prevented. In the sputtering process, moreover, the material goes through a highly excited state, and therefore carriers can be generated without heating a substrate.

In the case where the oxide has a rigid structure even if a diffraction line is not observed through X-ray diffraction (XRD) and no long distance order is present (typically it is called an amorphous state), oxygen coordination polyhedra (e.g., $InO_6$ octahedron and $TiO_6$ octahedron) and the linking form thereof (e.g., a chain of edge or plane sharing $InO_6$) are maintained, and therefore substitutional doping can be effectively affected. In the aforementioned structure, the density of states originated from tail states unique to amorphous states is small, sub-gap absorption is small, and an optical degration characteristic is superior to that of a material having a highly amorphous characteristic. On the other hand, doping is obviously effective, if the oxide is in a crystal state, and a grain boundary effect is small in the conduction band composed of 4s, 5s, or 6s bands of heavy-metal ions. In the case where a doping amount is excessively large, and segregation of a dopant is observed at a grain boundary, however, it is preferable to lower the dopant concentration. Moreover, it is preferred that post annealing be performed at 200° C. to 300° C. in order to improve adhesiveness and electric connection at the interface between the source-drain electrodes and the active layer. Moreover, annealing may be performed at higher temperature to enhance crystallinity.

The average thickness of the active layer is appropriately selected depending on the intended purpose without any limitation, but the average thickness thereof is preferably 5 nm to 1 μm, more preferably 10 nm to 0.5 μm.

<Gate Insulating Layer>

The gate insulating layer is appropriately selected depending on the intended purpose without any limitation, provided that it is an insulating layer provided between the gate electrode and the active layer.

A material of the gate insulating layer is appropriately selected depending on the intended purpose without any limitation, and examples thereof include: materials which have been widely used in manufacturing, such as $SiO_2$, and $SiN_x$; high dielectric constant materials, such as $La_2O_3$, and $HfO_2$; and organic materials, such as polyimide (PI), and a fluororesin.

A formation method of the gate insulating layer is appropriately selected depending on the intended purpose without any limitation, and examples thereof include a vacuum film forming method (e.g., sputtering, chemical vapor deposition (CVD), and atomic layer deposition (ALD)), and a printing method (e.g., spin coating, die coating, and inkjet printing).

The average thickness of the gate insulating layer is appropriately selected depending on the intended purpose without any limitation, but the average thickness thereof is preferably 50 nm to 3 μm, more preferably 100 nm to 1 μm.

Figure 2:
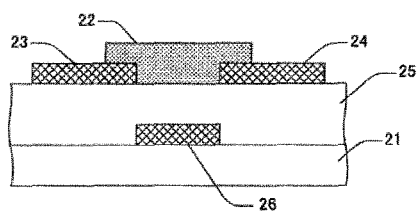
FIG. 2 is a schematic configuration diagram illustrating one example of a bottom contact/bottom gate field-effect transistor.
Figure 3:
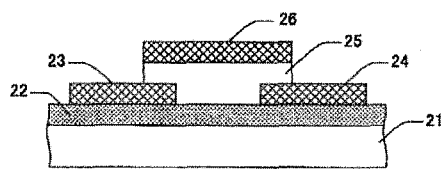
FIG. 3 is a schematic configuration diagram illustrating one example of a top contact/bottom gate field-effect transistor.
Figure 4:
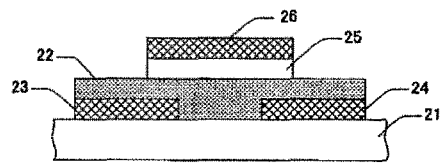
FIG. 4 is a schematic configuration diagram illustrating one example of a bottom contact/top gate field-effect transistor.

A structure of the field-effect transistor is appropriately selected depending on the intended purpose without any limitation, and examples thereof include top contact/bottom gate (FIG. 1), bottom contact/bottom gate (FIG. 2), top contact/top gate (FIG. 3), and bottom contact/top gate (FIG. 4).

Note that, in FIGS. 1 to 4, 21 is a substrate, 22 is an active layer, 23 is a source electrode, 24 is a drain electrode, 25 is a gate insulating layer, and 26 is a gate electrode.

The field-effect transistor is suitably used for the below-described display element, but use of the field-effect transistor is not limited to the display element. For example, the field-effect transistor can be used for IC cards, and ID tags.

<Production Method of Field-Effect Transistor>

One example of a production method of the field-effect transistor is explained.

First, a gate electrode is formed on a substrate.

A shape, structure, and size of the substrate are appropriately selected depending on the intended purpose without any limitation.

The material of the substrate is appropriately selected depending on the intended purpose without any limitation, and examples thereof include a glass substrate, and a plastic substrate.

The glass substrate is appropriately selected depending on the intended purpose without any limitation, and examples thereof include non-alkali glass, and silica glass.

The plastic substrate is appropriately selected depending on the intended purpose without any limitation, and examples thereof include polycarbonate (PC), polyimide (PI), polyethylene terephthalate (PET), and polyethylene naphthalate (PEN).

Note that, a pre-treatment, such as oxygen plasma, UV ozone, and UV radiation washing, is preferably performed on the substrate to clean a surface thereof and to improve adhesion with another layer.

Subsequently, a gate insulating layer is formed on the gate electrode.

Then, an active layer composed of n-type oxide semiconductor is formed on an area, which is a channel region and is above the gate insulating layer.

Subsequently, a source electrode and a drain electrode are formed with being apart from each other on the gate insulating layer in a manner that the source electrode and the drain electrode are respectively arranged at either side of the active layer.

In the manner as described above, a field-effect transistor is produced. In this production method, for example, a top contact/bottom gate field-effect transistor, as illustrated in FIG. 1, is produced.

(Display Element)

The display element of the present invention contains at least a light control element, and a driving circuit configured to drive the light control element, and may further contain other member according to the necessity.

<Light Control Element>

The light control element is appropriately selected depending on the intended purpose without any limitation, provided that it is an element configured to control light output according to a driving signal. Examples of the light control element include an electroluminescent (EL) element, an electrochromic (EC) element, a liquid crystal element, an electrophoretic element, and an electrowetting element.

<Driving Circuit>

The driving circuit is appropriately selected depending on the intended purpose without any limitation, provided that it contains the field-effect transistor of the present invention.

<Other Members>

Other members are appropriately selected depending on the intended purpose without any limitation.

As the display element contains the field-effect transistor of the present invention, high-speed driving and long service life can be realized, and characteristic variations among elements can be reduced. Moreover, a driving transistor can be operated at constant gate electrode, even when a change in the display element occurs with time.

(Image Display Device)

The image display device of the present invention contains at least a plurality of display elements, a plurality of lines, and a display control device, and may further contain other members according to the necessity.

<Plurality of Display Elements>

A plurality of the display elements are appropriately selected depending on the intended purpose without any limitation, provided that they are a plurality of the display elements of the present invention provided in a matrix form.

<Plurality of Lines>

A plurality of the lines are appropriately selected depending on the intended purpose without any limitation, provided that they can individually apply gate voltage and an image data signal to each field-effect transistor in the display elements.

<Display Control Device>

The display control device is appropriately selected depending on the intended purpose without any limitation, provided that it can individually control the gate voltage and the signal voltage of each field-effect transistor according to the image data through the lines.

<Other Members>

Other members are appropriately selected depending on the intended purpose without any limitation.

As the image display device contains the display element of the present invention, characteristic variations among elements can be reduced, and a large-screen image of high quality can be displayed.

(System)

The system of the present invention contains at least the image display device of the present invention, and an image data generating device.

The image data generating device is configured to generate image data based on image information to be displayed, and to output the image data to the image display device.

Since the system is equipped with the image display device of the present invention, image information can be highly precisely displayed.

The display element, image display device, and system of the present invention are explained through drawings hereinafter.

First, a television device as the system of the present invention is explained with reference to FIG. 5.

Figure 5:
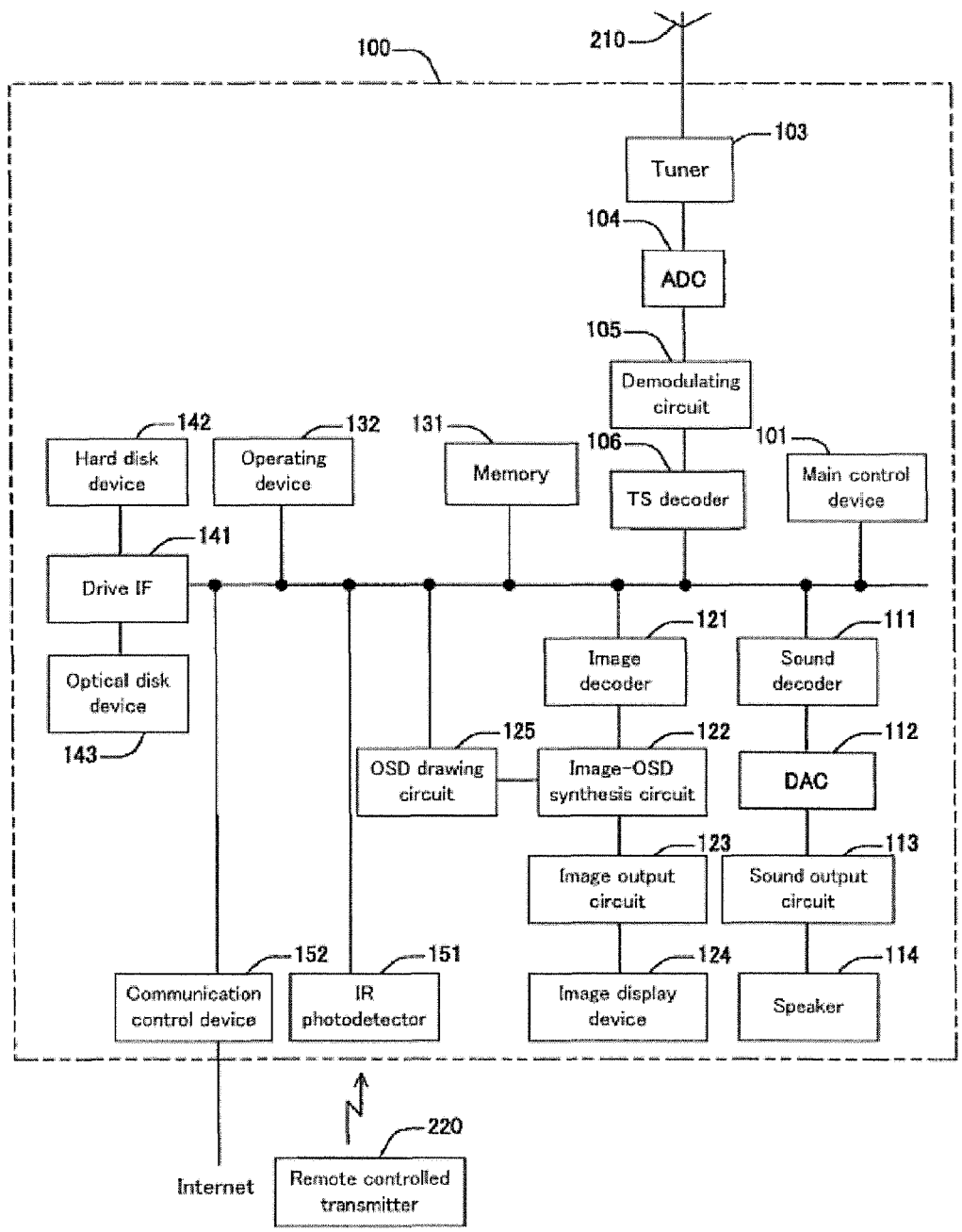
FIG. 5 is a schematic configuration diagram illustrating one example of a television device as the system of the present invention.

In FIG. 5, the television device 100 is equipped with a main control device 101, a tuner 103, an AD converter (ADC) 104, a demodulating circuit 105, transport stream (TS) decoder 106, a sound decoder 111, a DA converter (DAC) 112, a sound output circuit 113, a speaker 114, an image decoder 121, an image-OSD synthesis circuit 122, an image output circuit 123, an image display device 124, an OSD drawing circuit 125, a memory 131, an operating device 132, a drive interface (a drive IF) 141, a hard disk device 142, an optical disk device 143, an IR photodetector 151, and a communication control unit 152.

The image decoder 121, the image-OSD synthesis circuit 122, the image output circuit 123, and the OSD drawing circuit 125 constitute the image data creating device.

The main control device 101 is composed of CPU, flash ROM, and RAM, and is configured to control the entire television device 100.

In the flash ROM, a program written with a code that can be decoded with the CPU, and various data used for processing in the CPU are stored.

Moreover, RAM is a memory for operations.

The tuner 103 is configured to select channels, which have been set in advance, from the broadcast wave received by an aerial 210.

The ADC 104 is configured to convert the output signal (analog information) of the tuner 103 into digital information.

The demodulating circuit 105 is configured to demodulate the digital information from the ADC 104.

The TS decoder 106 is configured to TS decode the output signal of the demodulating circuit 105 to separate into sound information and image information.

The sound decoder 111 is configured to decode the sound information from the TS decoder 106.

The DA converter (DAC) 112 is configured to convert the output signal of the sound decoder 11 into analog signal.

The sound output circuit 113 is configured to output the output signal of the DA converter (DAC) 112 to the speaker 114.

The image decoder 121 is configured to decode the image information from the TS decoder 106.

The image-OSD synthesis circuit 122 is configured to synthesize an output signal of the image decoder 121 and an output signal of the OSD drawing circuit 125.

The image output circuit 123 is configured to output the output signals of the image-OSD synthesis circuit 122 to the image display device 124.

The OSD drawing circuit 125 is equipped with a character generator to display characters or graphics on a screen of the image display device 124, and is configured to generate a signal including display information based on the instructions from the operating device 132 and the IR photodetector 151.

The memory 131 is configured to temporarily store audiovisual (AV) data.

The operating device 132 is equipped with an input medium (not illustrated), such as a control panel, and is configured to inform various information, which has been input by a user, to the main control device 101.

The drive IF 141 is an interactive communication interface. As one example, the drive IF is according to ATA packet interface (ATAPI).

The hard disk device 142 is composed of a hard disk, and a driving device configured to drive the hard disk. The driving device records data on the hard disk, as well as reproducing the data recorded in the hard disk.

The optical disk device 143 records data on an optical disk (e.g., DVD), as well as reproducing the data recorded on the optical disk.

The IR photodetector 151 receives photosignal from a remote-controlled transmitter 220, and reports to the main control device 101.

The communication control unit 152 controls communication with internet. Various types of information can be obtained via internet.

Figure 6:
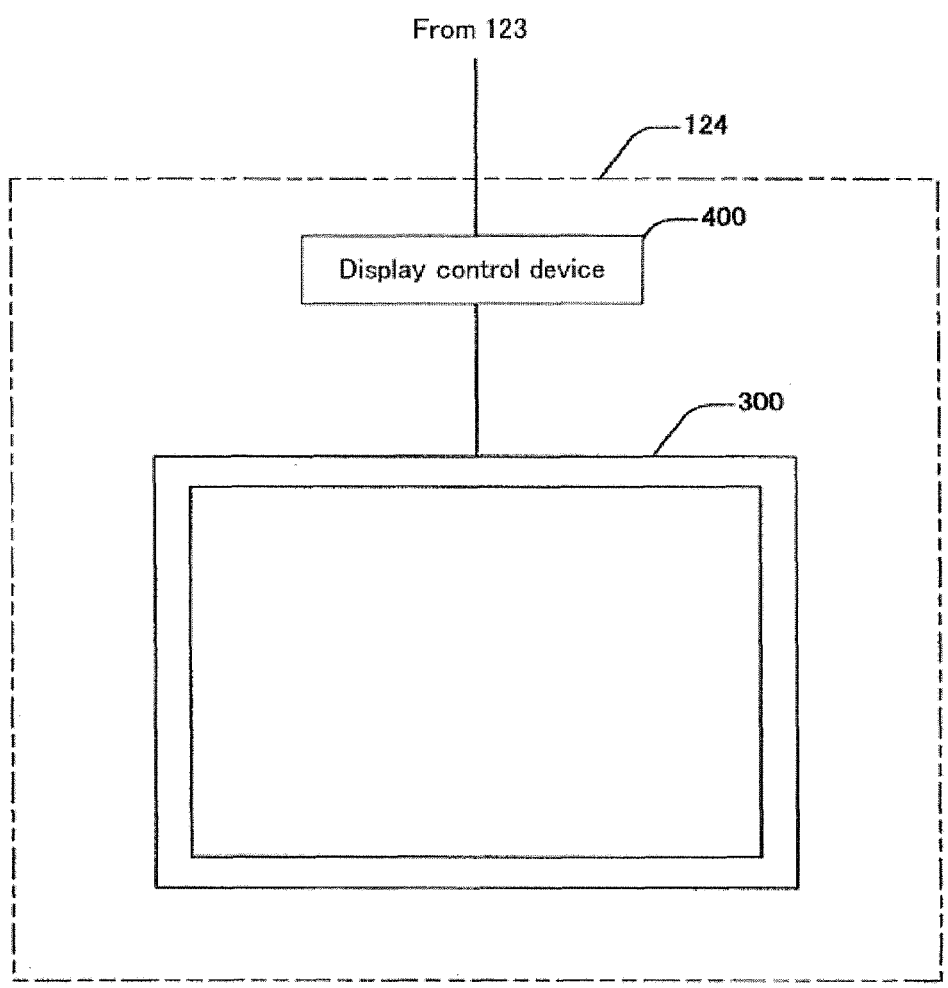
FIG. 6 is a diagram for explaining the image display device of FIG. 5 (part 1).

FIG. 6 is a schematic configuration diagram illustrating one example of the image display device of the present invention.

In FIG. 6, the image display device 124 contains a display unit 300, and a display control device 400.

Figure 7:
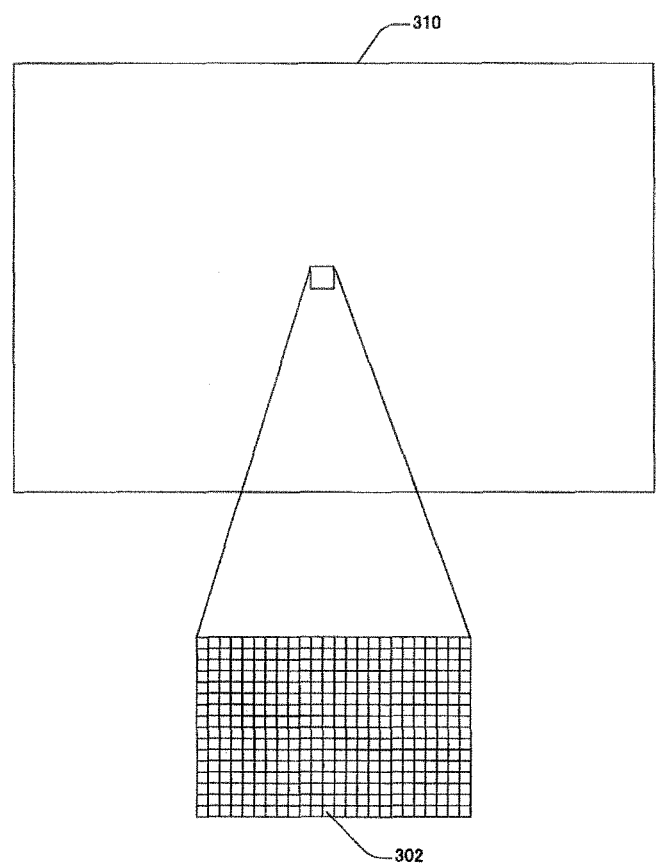
FIG. 7 is a diagram for explaining the image display device of FIG. 5 (part 2).

As illustrated in FIG. 7, the display unit 300 contains a display 310, in which a plurality (the number "n"×the number "m" in this case) of the display elements 302 are arranged on a matrix.

Figure 8:
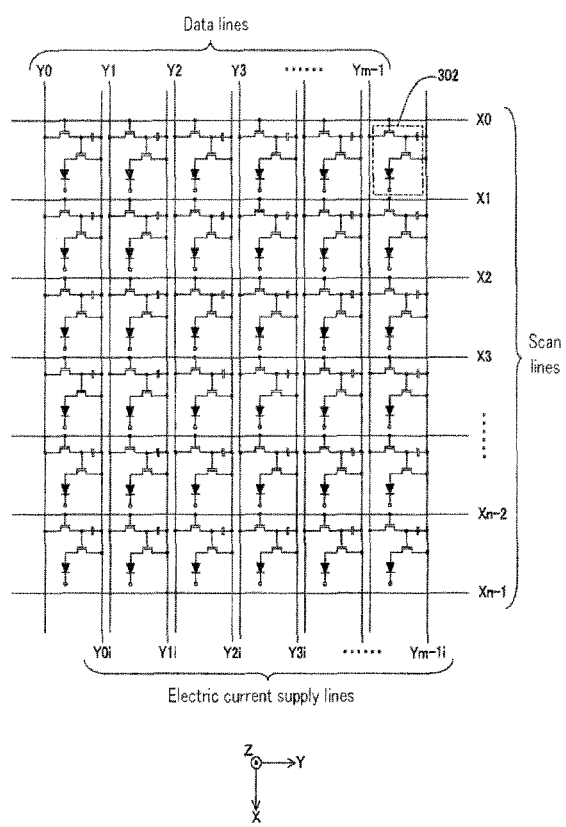
FIG. 8 is a diagram for explaining the image display device of FIG. 5 (part 3).

As illustrated in FIG. 8, moreover, the display 310 contains "n" number of scanning lines (X0, X1, X2, X3, . . . Xn−2, Xn−1) arranged along the X axis direction with a constant interval, "m" number of data lines (Y0, Y1, Y2, Y3, . . . Ym−1) arranged along the Y axis direction with a constant interval, and "m" number of current supply lines (Y0i, Y1i, Y2i, Y3i, . . . Ym−1i) arranged along the Y axis direction with a constant interval.

As described, the display element is specified with the scanning line and the data line.

The display element of the present invention is explained with reference to FIG. 9, hereinafter.

Figure 9:
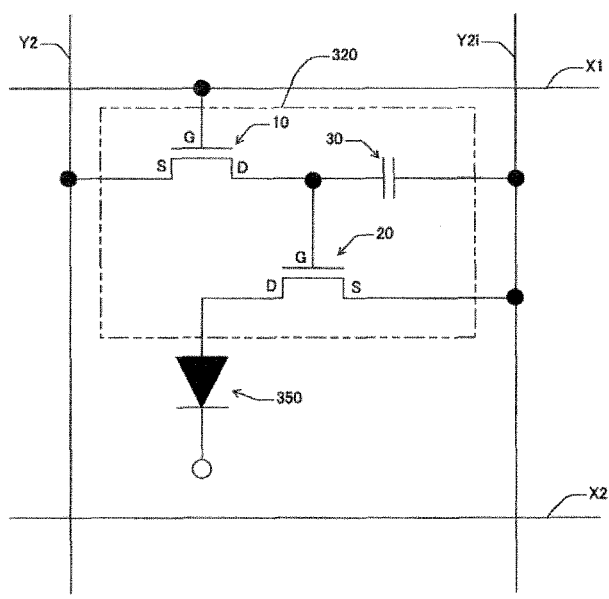
FIG. 9 is a diagram for explaining one example of the display element of the present invention.

FIG. 9 is a schematic configuration diagram illustrating one example of the display element of the present invention.

As illustrated in FIG. 9 as one example, the display element contains an organic electroluminescent (EL) element 350, and a driving circuit 320 configured to emit light from the organic EL element 350. Specifically, the display 310 is an organic EL display of a so-called active matrix system. Moreover, the display 310 is a 32-inch color display. Note that, a size of the display is not limited to the aforementioned size.

Figure 10:
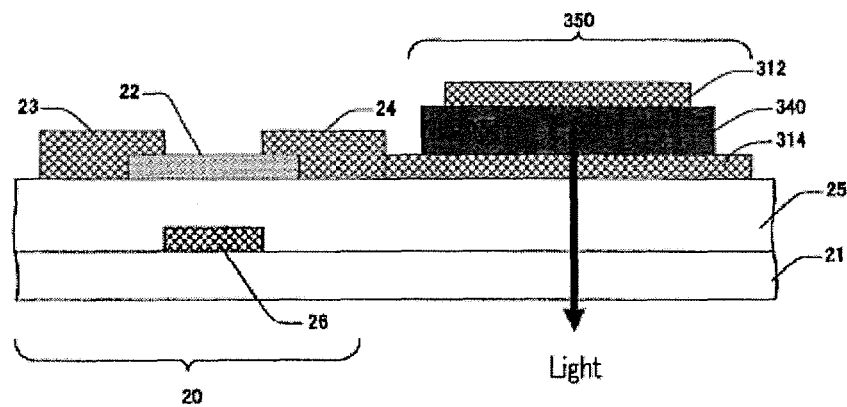
FIG. 10 is a schematic configuration diagram illustrating one example of a positional relationship between an organic EL element and a field-effect transistor in a display element.

FIG. 10 illustrates a positional relationship between an organic EL element 350 and a field-effect transistor 20 as a driving circuit in a display element 302. In this example, the organic El element 350 is provided next to the field-effect transistor 20. Note that, the field-effect transistor 10 and a capacitor (not illustrated) are formed on the identical substrate.

Although it is not illustrated in FIG. 10, it is preferred that a passivation film is provided above the active layer 22. As for a material of the passivation film, $SiO_2$, $SiN_x$, $Al_2O_3$, or a fluoropolymer is suitably used.

Figure 11:
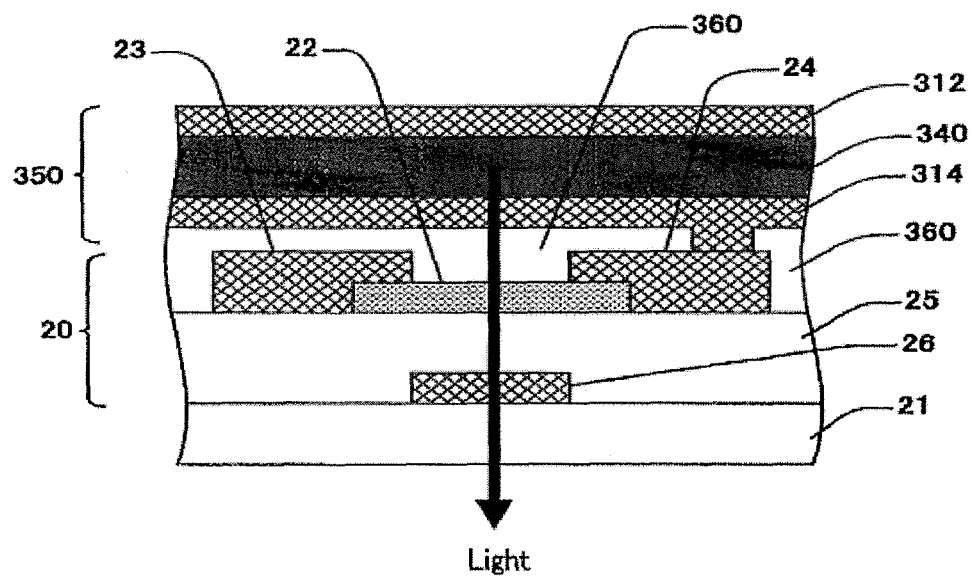
FIG. 11 is a schematic configuration diagram illustrating another example of a positional relationship between an organic EL element and a field-effect transistor in a display element.

As illustrated in FIG. 11, for example, the organic EL element 350 may be provided on the field-effect transistor 20. In this case, transparency is required for the gate electrode 26. As for the gate electrode 26, therefore, a transparent electroconductive oxide, such as ITO, $In_2O_3$, $SnO_2$, ZnO, Ga-added ZnO, Al-added ZnO, and Sb-added $SnO_2$, is used. Note that, the reference number 360 represents an interlayer insulating film (a leveling film). As for the interlayer insulating film, polyimide, or an acrylic resin can be used.

Figure 12:
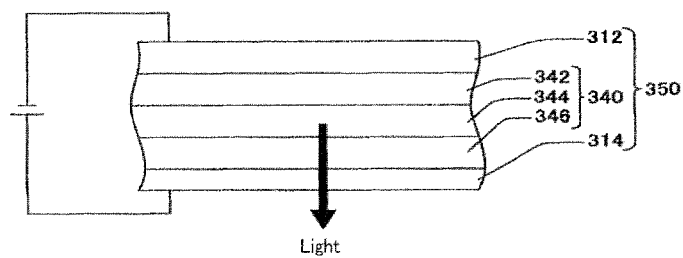
FIG. 12 is a schematic configuration diagram illustrating one example of an organic EL element.

FIG. 12 is a schematic configuration diagram illustrating one example of an organic EL element.

In FIG. 12, the organic EL element 350 contains a cathode 312, an anode 314, and an organic EL film layer 340.

A material of the cathode 312 is appropriately selected depending on the intended purpose without any limitation, and examples thereof include aluminum (Al), magnesium (Mg)-silver (Ag) alloy, aluminum (Al)-lithium (Li) alloy, and indium tin oxide (ITO). Note that, the magnesium (Mg)-silver (Ag) alloy forms a high reflectance electrode with a sufficient thickness thereof, and an extremely thin film (less than about 20 nm) thereof forms a semi-transparent electrode. In FIG. 12, light is taken out from the side of the anode, but light can be taken out from the side of the cathode, by making the cathode a transparent or semi-transparent electrode.

A material of the anode 314 is appropriately selected depending on the intended purpose without any limitation, and examples thereof include indium tin oxide (ITO), indium zinc oxide (IZO), and silver (Ag)-neodymium (Nd) alloy. Note that, in the case where the silver alloy is used, a resulting electrode becomes a high reflectance electrode, which is suitable for taking light out from the side of the cathode.

The organic EL thin film layer 340 contains an electron transporting layer 342, a light emitting layer 344, and a hole transporting layer 346. The electron transporting layer 342 is connected to the cathode 312, and the hole transporting layer 346 is connected to the anode 314. The light emitting layer 344 emits light, as the predetermined voltage is applied between the anode 314 and the cathode 312.

Here, the electron transporting layer 342 and the light emitting layer 344 may form one layer. Moreover, an electron injecting layer may be provided between the electron transporting layer 342 and the cathode 312. Further, a hole injecting layer may be provided between the hole transporting layer 346 and the anode 314.

As for the light control element, moreover, the so-called "bottom emission" organic EL element, in which light is taken out from the side of the substrate, is explained. However, the light control element may be a "top emission" organic EL element, in which light is taken out from the opposite side to the substrate.

The driving circuit 320 of FIG. 9 is explained.

The driving circuit 320 contains two field-effect transistors 10, 20, and a capacitor 30.

The field-effect transistor 10 functions as a switching element. The gate electrode G of the field-effect transistor 10 is connected to the predetermined scanning lines, and the source electrode S of the field-effect transistor 10 is connected to the predetermined data line. Moreover, the drain electrode D of the field-effect transistor 10 is connected to one terminal of the capacitor 30.

The field-effect transistor 20 is configured to supply electric current to the organic EL element 350. The gate electrode G of the field-effect transistor 20 is connected to the drain electrode D of the field-effect transistor 10. The drain electrode D of the field-effect transistor 20 is connected to the anode 314 of the organic EL element 350, and the source electrode S of the field-effect transistor 20 is connected to the predetermined current supply line.

The capacitor 30 is configured to store a state of the field-effect transistor 10, i.e., data. The other terminal of the capacitor 30 is connected to the predetermined current supply line.

As the field-effect transistor 10 is turned in the state of "On," the image data is stored in the capacitor 30 via the signal line Y2. Even after turning the field-effect transistor 10 in the state of "Off," the field-effect transistor 20 is maintained in the state of "On" corresponding to the image data so that the organic EL element 350 is driven.

Figure 13:
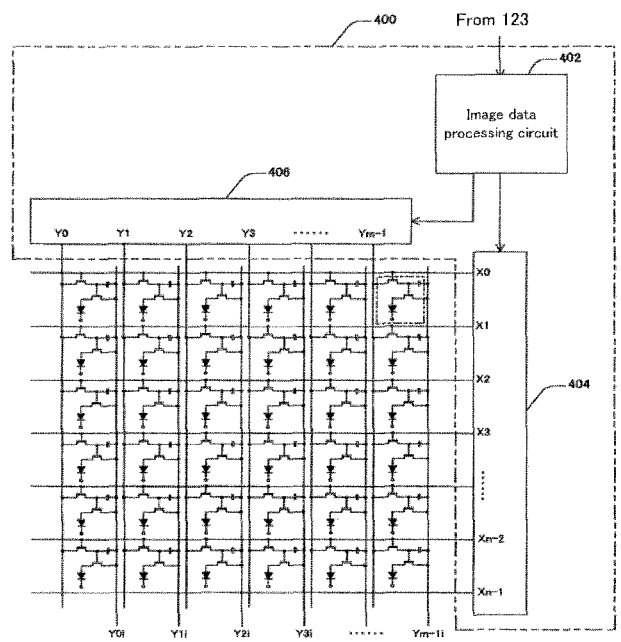
FIG. 13 is a diagram for explaining a display control device.

FIG. 13 is a schematic configuration diagram illustrating another example of the image display device of the present invention.

In FIG. 13, the image display device contains a display element 302, lines (scanning lines, data lines, and current supply lines), and a display control device 400.

The display control device 400 contains an image data processing circuit 402, a scanning line driving circuit 404, and a data line driving circuit 406.

The image data processing circuit 402 judges luminance of a plurality of the display elements 302 in the display based on output signal of the image output circuit 123.

The scanning line driving circuit 404 individually applies voltage to the number "n" of scanning lines according to the instructions of the image data processing circuit 402.

The data line driving circuit 406 individually applies voltage to the number "m" of data lines according to the instruction of the image data processing circuit 402.

The embodiment above explains the case where the light control element is an organic EL element, but the light control element is not limited to the organic EL element. For example, the light control element may be an electrochromic element. In this case, the display is an electrochromic display.

Figure 14:
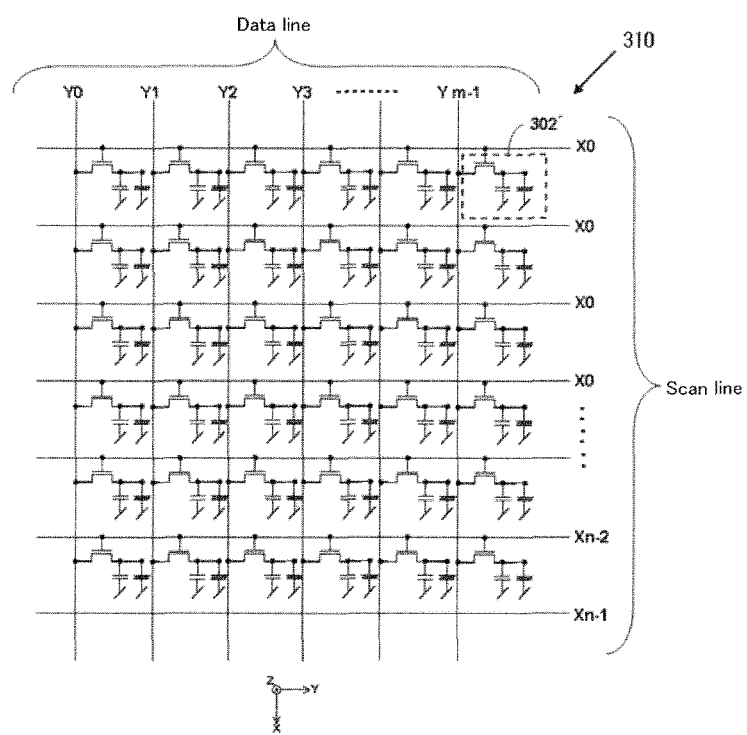
FIG. 14 is a diagram for explaining a liquid crystal display.
Figure 15:
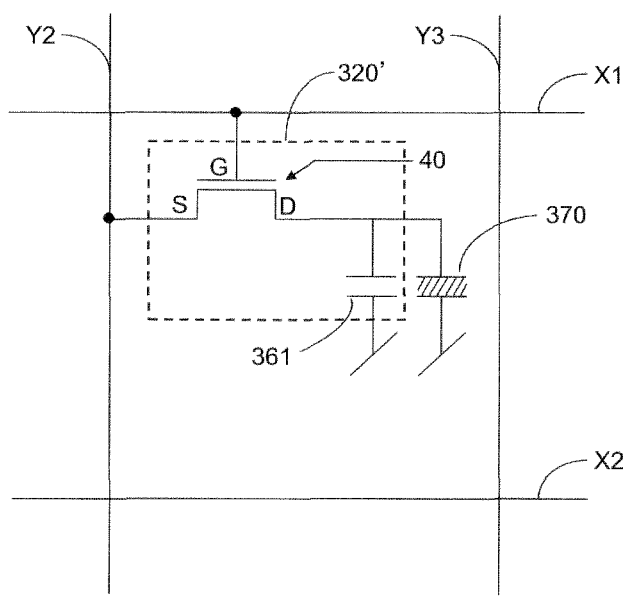
FIG. 15 is a diagram for explaining the display element of FIG. 14.

Moreover, the light control element may be a liquid crystal element. In this case, the display is a liquid crystal display, and a current supply line is not necessary to the display element 302' as illustrated in FIG. 14. As illustrated in FIG. 15, moreover, the driving circuit 320' may be composed of one field-effect transistor 40, which is identical to the field-effect transistors 10 and 20. In the field-effect transistor 40, the gate electrode G is connected to the predetermined scanning line, and the source electrode S is connected to the predetermined data line. Moreover, the drain electrode D is connected to the capacitor 361 and a pixel electrode of the liquid crystal element 370.

Moreover, the light control element may be an electrophoretic element, an inorganic EL element, or an electrowetting element.

The case where the system of the present invention is a television device is explained above, but the system is not limited as long as the system contains the image display device 124 as a device for displaying images and information. For example, the system may be a computer system, in which a computer (including a personal computer) is connected to the image display device 124.

Moreover, the image display device 124 can be used as a display unit in a mobile information device (e.g., a mobile phone, a portable music player, a portable video player, an electronic book, a personal digital assistant (PDA)), or a camera device (e.g., a still camera, a video camera). The image display device 124 can be used as a display unit for various types of information in a transport system (e.g., a car, an air craft, a train, and a ship). Furthermore, the image display device 124 can be used as a display unit for various types of information in a measuring device, an analysis device, a medical equipment, or advertising media.

EXAMPLES

Examples of the present invention are explained hereinafter, but Examples shall not be construed as to limit the scope of the present invention in any way.

Example 1

A non-alkali glass substrate was subjected to ultrasonic washing using a neutral detergent, pure water, and isopropyl alcohol. After drying the substrate, the substrate was subjected to UV-ozone processing for 10 minutes at 90° C.

To the substrate, a film of Mo having a thickness of 100 nm was formed by DC magnetron sputtering, and the film was pattern by photolithography, to thereby form a gate electrode. Next, a film of $SiO_2$ having a thickness of 200 nm was formed by RF magnetron sputtering to thereby form a gate insulating layer. Then, a film of $BaIn_2O_4$ doped with Sn having a thickness of 50 nm was formed using a sintered body of $BaIn_{1.98}Sn_{0.02}O_4$ by RF magnetron sputtering. As sputtering gas, argon gas and oxygen gas were introduced. The total pressure was fixed at 1.1 Pa. and the oxygen concentration was varied as a parameter in the range of 4% to 60%, to thereby form an active layer. The patterning was performed by forming the film through a metal mask. Next. Al was deposited to give 100 nm through a metal mask to thereby form a source and drain electrodes. The channel length thereof was 50 μm, and the channel width thereof was 400 μm. Finally, annealing was carried out for 1 hour at 300° C. in the air, thereby fabricating a field-effect transistor. Note that, the $BaIn_2O_4$ doped with Sn, which was the active layer, had symmetry of the point group $C_{2h}$ and the space group No. 14.

Comparative Example 1

A field-effect transistor was produced in the same manner as in Example 1, provided that the sintered body target used in the formation of the active layer was changed to $BaIn_2O_4$ as depicted in Table 1, to thereby form an active layer.

Examples 2 to 36

Each field-effect transistor was produced in the same manner as in Example 1, provided that the sintered body target used in the formation of the active layer was changed as depicted in Tables 2 and 3, to thereby form an active layer.
<Evaluation Results>
Table 1 shows the evaluation results of mobility of the field-effect transistors of Example 1 and Comparative Example 1, when the oxygen concentration during the formation of the active layer was 4% and 40%.
Note that, the mobility was calculated from the transfer properties.

TABLE 1

| Sputtering target | Mobility at oxygen concentration of 4% ($cm^2/Vs$) | Mobility at oxygen concentration of 40% ($cm^2/Vs$) |
|---|---|---|
| Ex. 1 | $BaIn_{1.98}Sn_{0.02}O_4$ | 4.55 | 4.48 |
| Comp. Ex. 1 | $BaIn_2O_4$ | 3.97 | 0.15 |

Figure 16:
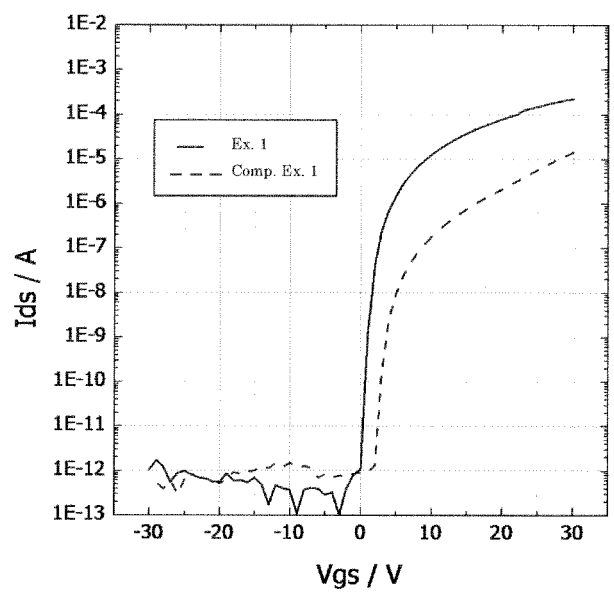
FIG. 16 is a diagram for explaining properties of the field-effect transistors of Example 1 and Comparative Example 1.

FIG. 16 shows transfer properties (Vds=20 V) of the field-effect transistors of Example 1 and Comparative Example 1 with the oxygen concentration of 40% during the formation of the active layer. In Example 1 where the active layer was doped with Sn, the rising on-voltage voltage (Von) was 0 V, the mobility was 4.5 $cm^2/Vs$, and the on-off ratio was 8 digits, and excellent normally-off properties were exhibited. In Comparative Example 1 where no doping was performed on the active layer, the rising on-voltage (Von) was 1.5 V, the mobility was 0.2 $cm^2/Vs$, and the on-off ratio was 7 digits. The rising on-voltage was shifted to the positive side and the mobility was reduced compared to Example 1.

Note that, in FIG. 16, "E" denotes "the exponent of 10." For example, "E-04" represents "0.0001."

Figure 17:
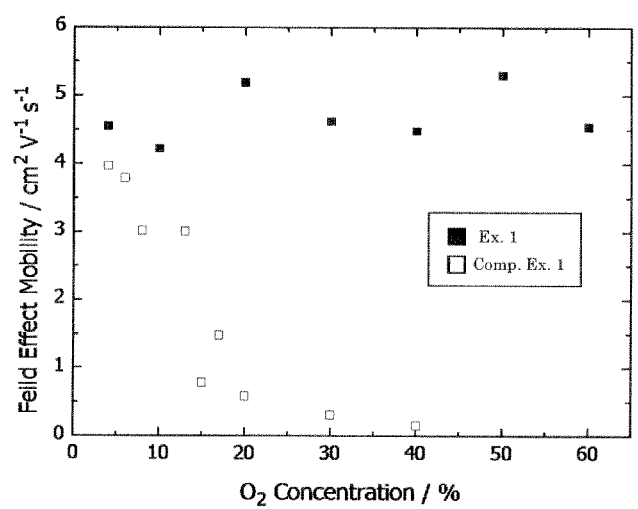
FIG. 17 is a diagram for explaining a relationship between an oxygen concentration in the deposition process of the oxide semiconductor film, and field effect mobility, as properties of the field-effect transistors of Example 1 and Comparative Example 1.

Moreover, relationships between the oxygen concentration during the formation of the active layer and a field-effect mobility of the field-effect transistors of Example 1 and Comparative Example 1 are depicted in FIG. 17. In Example 1, the mobility was about 4.7±0.4 $cm^2/Vs$ and substantially constant with the oxygen concentration of 4% to 60%, and the mobility thereof did not have a dependency to the oxygen concentration. On the other hand, in Comparative Example 1, the similar mobility to that of Example 1 was exhibited at the oxygen concentration of 4%, but the mobility monotonically decreased as the oxygen concentration increased. The mobility decreased to 1/10 or smaller at the oxygen concentration of 40%. The reasons for this were considered as follows. In Example 1, n-type doping was carried out by introducing Sn, and carriers were generated from Sn substituting the indium site, and therefore, the amount of the carriers was maintained constant even when the oxygen concentration increased. In Comparative Example 1 where no doping was performed, oxygen vacancy in the active layer decreased as the oxygen concentration increased, thereby the carrier concentration decreased. As a result, the contact resistance with the source and drain electrodes increased, and therefore reduction in the mobility was observed.

Next, the evaluation results of the mobility of the field-effect transistors of Examples 2 to 36 at the oxygen concentration of 4% and 40% during the formation of the active layer are depicted in Tables 2 and 3. Similarly to Example 1, it was found that there was no change in the mobility between the oxygen concentration of 4% and the oxygen concentration of 40%. Specifically, it was considered that the substituted cation acted as an n-type dopant to generate electron carriers so that constant properties were exhibited regardless of the oxygen amount.

TABLE 2

| Ex. | Sputtering target | Crystal system | Point group | Space group No. | Mobility at oxygen concentration of 4% ($cm^2/Vs$) | Mobility at oxygen concentration of 40% ($cm^2/Vs$) |
|---|---|---|---|---|---|---|
| 2 | $Cu_{1.98}Zn_{0.02}WO_4$ | T | $C_1$ | 1 | 2.36 | 2.12 |
| 3 | $Cd_2Ge_{2.97}Sb_{0.03}O_8$ | T | $C_i$ | 2 | 4.73 | 4.89 |
| 4 | $Hg_{0.99}Tl_{0.01}TeO_3$ | T | $C_i$ | 2 | 2.89 | 2.56 |
| 5 | $SrGa_{1.98}Zr_{0.02}O_4$ | M | $C_2$ | 3 | 1.91 | 1.74 |
| 6 | $Pb_{2.97}Bi_{0.03}GeO_5$ | M | $C_2$ | 4 | 1.53 | 1.47 |
| 7 | $W_5Nb_{15.9}Mo_{0.1}O_{55}$ | M | $C_2$ | 5 | 2.25 | 2.41 |
| 8 | $Pb_3Bi_{2.98}Te_{0.02}GeO_8$ | M | $C_s$ | 6 | 1.45 | 1.38 |
| 9 | $Li_{4.95}Mg_{0.05}BiO_5$ | M | $C_s$ | 8 | 2.78 | 2.62 |
| 10 | $Bi_2Ge_{0.98}Sb_{0.02}O_5$ | M | $C_s$ | 9 | 1.37 | 1.22 |

TABLE 2-continued

| Ex. | Sputtering target | Crystal system | Point group | Space group No. | Mobility at oxygen concentration of 4% (cm$^2$/Vs) | Mobility at oxygen concentration of 40% (cm$^2$/Vs) |
|---|---|---|---|---|---|---|
| 11 | $Cd_{0.98}In_{0.02}TeO_3$ | M | $C_{2h}$ | 10 | 5.24 | 5.16 |
| 12 | $Ba_4In_{5.94}Sn_{0.06}O_{13}$ | M | $C_{2h}$ | 11 | 4.23 | 4.49 |
| 13 | $In_{1.99}W_{0.01}Ge_2O_7$ | M | $C_{2h}$ | 12 | 5.02 | 4.93 |
| 14 | $Zn_{0.99}Ga_{0.01}WO_4$ | M | $C_{2h}$ | 13 | 2.69 | 2.55 |
| 15 | $Cd_{0.99}In_{0.01}SiO_3$ | M | $C_{2h}$ | 14 | 5.47 | 5.64 |
| 16 | $Li_{1.98}Mg_{0.02}WO_4$ | M | $C_{2h}$ | 15 | 1.87 | 1.95 |
| 17 | $Cd_{1.98}In_{0.02}Ge_2O_6$ | M | $C_{2h}$ | 15 | 6.31 | 6.67 |
| 18 | $Pb_{4.95}Bi_{0.05}Ge_3O_{11}$ | R | $C_3$ | 143 | 1.46 | 1.23 |
| 19 | $LiZnV_{0.99}Mo_{0.01}O_4$ | R | $C_{3i}$ | 147 | 2.23 | 2.01 |
| 20 | $ZnTi_{0.99}V_{0.01}O_3$ | R | $C_{3i}$ | 148 | 3.56 | 3.49 |

In Tables 2 and 3, "T" in the crystal system denotes triclinic, "M" denotes monoclinic, and "R" denotes trigonal.

TABLE 3

| Ex. | Sputtering target | Crystal system | Point group | Space group No. | Mobility at oxygen concentration of 4% (cm$^2$/Vs) | Mobility at oxygen concentration of 40% (cm$^2$/Vs) |
|---|---|---|---|---|---|---|
| 21 | $Li_{1.98}Mg_{0.02}MoO_4$ | R | $C_{3i}$ | 148 | 1.69 | 1.54 |
| 22 | $SrSn_{0.99}Sb_{0.01}TeO_6$ | R | $D_3$ | 149 | 2.1 | 1.98 |
| 23 | $PbAs_{1.98}Mo_{0.02}O_6$ | R | $D_3$ | 149 | 1.76 | 1.6 |
| 24 | $In_{1.98}Sn_{0.02}TeO_6$ | R | $D_3$ | 150 | 4.82 | 4.88 |
| 25 | $La_{2.97}Hf_{0.03}Ga_5SnO_{14}$ | R | $D_3$ | 150 | 1.49 | 1.35 |
| 26 | $Tl_{1.98}Pb_{0.02}TeO_6$ | R | $D_3$ | 150 | 3.56 | 3.49 |
| 27 | $BaZn_{0.99}Ge_{0.01}O_2$ | R | $D_3$ | 152 | 4.67 | 4.33 |
| 28 | $Pb_2Nb_{1.98}Mo_{0.02}O_7$ | R | $C_{3v}$ | 156 | 1.54 | 1.4 |
| 29 | $Cd_{0.99}In_{0.01}Sb_2O_6$ | R | $C_{3v}$ | 157 | 3.68 | 3.52 |
| 30 | $PbTa_{1.98}W_{0.02}O_6$ | R | $C_{3v}$ | 160 | 2.11 | 2.08 |
| 31 | $PbSb_{1.98}W_{0.02}O_6$ | R | $D_{3d}$ | 162 | 1.39 | 1.51 |
| 32 | $Li_3In_{0.99}Sn_{0.01}O_3$ | R | $D_{3d}$ | 165 | 3.81 | 3.53 |
| 33 | $Tl_2Ge_{2.97}As_{0.03}O_9$ | R | $D_{3d}$ | 165 | 3.27 | 3.51 |
| 34 | $In_{1.98}Sn_{0.02}Zn_3O_6$ | R | $D_{3d}$ | 166 | 7.51 | 7.78 |
| 35 | $Ag_{0.99}Cd_{0.01}InO_2$ | R | $D_{3d}$ | 166 | 4.58 | 4.36 |
| 36 | $Ba_{2.97}La_{0.03}W_2O_9$ | R | $D_{3d}$ | 167 | 2.97 | 2.64 |

Specifically, the field-effect transistor containing, as an active layer, the n-type oxide semiconductor, in which electron carriers were generated through substitutional doping of cations, stably exhibited high mobility over a wide process range, and attained excellent properties of normally-off, compared to the field-effect transistor containing, as an active layer, the oxide semiconductor, in which carriers were generated by controlling only an oxygen amount.

As explained above, the field-effect transistor of the present invention is suitable for increasing a process margin, and stabilizing TFT properties at a high level. Moreover, the display element of the present invention can be driven at high speed, and is suitable for improving reliability with reducing variations among elements. The image display device of the present invention is suitably for displaying a high quality image with a large screen. Moreover, the system of the present invention can highly precisely display image information, and is suitably used for a television device, a computer system and so on.

The embodiments of the present invention are as follows:
<1> A field-effect transistor, containing:
  a gate electrode configured to apply gate voltage;
  a source electrode and a drain electrode, which are configured to extract electric current;
  an active layer formed of a n-type oxide semiconductor, provided in contact with the source electrode and the drain electrode; and
  a gate insulating layer provided between the gate electrode and the active layer,
  wherein the n-type oxide semiconductor is a triclinic crystal compound, a monoclinic crystal compound, or a trigonal crystal compound, each of which is substitutionally doped with at least one dopant selected from the group consisting of a divalent cation, a trivalent cation, a tetravalent cation, a pentavalent cation, and a hexavalent cation, and wherein a valence of the dopant is greater than a valence of a metal ion constituting the n-type oxide semiconductor, excluding the dopant.
<2> The field-effect transistor according to <1>, wherein the n-type oxide semiconductor is a triclinic crystal compound, which is substitutionally doped with at least one dopant selected from the group consisting of a divalent cation, a trivalent cation, a tetravalent cation, a pentavalent cation, and a hexavalent cation.
<3> The field-effect transistor according to <2>, wherein the triclinic crystal compound belongs to the point group $C_1$ or $C_i$, and the substitutional doping is performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.
<4> The field-effect transistor according to <3>, wherein the triclinic crystal compound belongs to the space group No. 1 or No. 2, and contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

<5> The field-effect transistor according to <1>, wherein the n-type oxide semiconductor is a monoclinic crystal compound, which is substitutionally doped with at least one dopant selected from the group consisting of a divalent cation, a trivalent cation, a tetravalent cation, a pentavalent cation, and a hexavalent cation.

<6> The field-effect transistor according to <5>, wherein the monoclinic crystal compound belongs to the point group $C_2$, $C_3$, or $C_{2h}$, and the substitutional doping is performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.

<7> The field-effect transistor according to <6>, wherein the monoclinic crystal compound belongs to any of the space group Nos. 3 to 15, and contains a cation of at least one selected from the group consisting of Li, Cu, Ag, Au, Mg, Ca, Sr, Ba, Zn, Cd, Hg, La, Ga. In, Tl, Ge, Sn, Pb, Ti, As, Sb, Bi, V, Nb, Ta, Te, Mo, and W.

<8> The field-effect transistor according to <1>, wherein the n-type oxide semiconductor is a trigonal crystal compound, which is substantially doped with at least one dopant selected from the group consisting of a divalent cation, a trivalent cation, a tetravalent cation, a pentavalent cation, and a hexavalent cation.

<9> The field-effect transistor according to <8>, wherein the trigonal crystal compound belongs to the point group $C_3$, $C_{3i}$, $D_3$, $C_{3v}$, or $D_{3d}$, and the substitutional doping is performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.

<10> The field-effect transistor according to <9>, wherein the trigonal crystal compound belongs to any of the space group Nos. 143 to 167, and contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

<11> A display element, containing:

a light control element configured to control light output according to a driving signal; and a driving circuit, which contains the field-effect transistor according to any one of <1> to <10>, and is configured to drive the light control element.

<12> The display element according to <11>, wherein the light control element contains an electroluminescent element, or an electrochromic element.

<13> The display element according to <11>, wherein the light control element contains a liquid crystal element, or an electrophoretic element.

<14> An image display device, which displays an image corresponding to image data, the image display device comprising:

a plurality of the display elements according to any of <11> to

<13> arranged in a matrix;

a plurality of lines configured to separately apply gate voltage to field-effect transistors in each of the display elements; and a display control device configured to individually control the gate voltage of each of the field-effect transistors through the lines corresponding to the image data.

<15> A system, containing:

the image display device according to <14>; and an image data generating device, configured to generate an image data based on image information to be displayed, and to output the generated image data to the image display device.

This application claims priority to Japanese application No. 2013-136422, filed on Jun. 28, 2013 and incorporated herein by reference, and Japanese application No. 2014-095182, filed on May 2, 2014 and incorporated herein by reference.

What is claimed is:

1. A field-effect transistor, comprising:
a gate electrode configured to apply gate voltage;
a source electrode and a drain electrode, which are configured to extract electric current;
an active layer formed of a n-type oxide semiconductor, provided in contact with the source electrode and the drain electrode; and
a gate insulating layer provided between the gate electrode and the active layer,
wherein the n-type oxide semiconductor is a triclinic crystal compound, a monoclinic crystal compound, or a trigonal crystal compound, each of which is substitutionally doped with at least one dopant selected from the group consisting of a divalent cation, a trivalent cation, a tetravalent cation, a pentavalent cation, and a hexavalent cation, and
wherein a valence of the dopant is greater than a valence of a metal ion constituting the n-type oxide semiconductor, excluding the dopant.

2. The field-effect transistor according to claim 1, wherein the n-type oxide semiconductor is a triclinic crystal compound, which is substitutionally doped with at least one dopant selected from the group consisting of a divalent cation, a trivalent cation, a tetravalent cation, a pentavalent cation, and a hexavalent cation.

3. The field-effect transistor according to claim 2, wherein the triclinic crystal compound belongs to the point group $C_1$ or $C_i$, and the substitutional doping is performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.

4. The field-effect transistor according to claim 3, wherein the triclinic crystal compound belongs to the space group No. 1 or No. 2, and contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

5. The field-effect transistor according to claim 1, wherein the n-type oxide semiconductor is a monoclinic crystal compound, which is substitutionally doped with at least one dopant selected from the group consisting of a divalent cation, a trivalent cation, a tetravalent cation, a pentavalent cation, and a hexavalent cation.

6. The field-effect transistor according to claim 5, wherein the monoclinic crystal compound belongs to the point group $C_2$, $C_s$, or $C_{2h}$, and the substitutional doping is performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.

7. The field-effect transistor according to claim 6, wherein the monoclinic crystal compound belongs to any of the space group Nos. 3 to 15, and contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

8. The field-effect transistor according to claim 1, wherein the n-type oxide semiconductor is a trigonal crystal compound, which is substantially doped with at least one dopant selected from the group consisting of a divalent cation, a trivalent cation, a tetravalent cation, a pentavalent cation, and a hexavalent cation.

9. The field-effect transistor according to claim 8, wherein the trigonal crystal compound belongs to the point group $C_3$, $C_{3i}$, $D_3$, $C_{3v}$, or $D_{3d}$, and the substitutional doping is performed by introduction of a cation of at least one selected from the group consisting of Mg, Ca, Sr, Ba, Zn, Cd, Hg, Al, Ga, In, Tl, Ge, Sn, Pb, Ti, Zr, Hf, Ce, V, Nb, Ta, As, Sb, Bi, Mo, W, and Te.

10. The field-effect transistor according to claim 9, wherein the trigonal crystal compound belongs to any of the space group Nos. 143 to 167, and contains a cation of at least one selected from the group consisting of Li, Cu, Ag, Au, Mg, Ca, Sr, Ba, Zn, Cd, Hg, La, Ga, In, Tl, Ge, Sn, Pb, Ti, As, Sb, Bi, V, Nb, Ta, Te, Mo, and W.

11. A display element, comprising:
a light control element configured to control light output according to a driving signal; and
a driving circuit, which contains a field-effect transistor, and is configured to drive the light control element,
wherein the field-effect transistor contains:
a gate electrode configured to apply gate voltage;
a source electrode and a drain electrode, which are configured to extract electric current;
an active layer formed of a n-type oxide semiconductor, provided in contact with the source electrode and the drain electrode; and
a gate insulating layer provided between the gate electrode and the active layer,
wherein the n-type oxide semiconductor is a triclinic crystal compound, a monoclinic crystal compound, or a trigonal crystal compound, each of which is substitutionally doped with at least one dopant selected from the group consisting of a divalent cation, a trivalent cation, a tetravalent cation, a pentavalent cation, and a hexavalent cation, and
wherein a valence of the dopant is larger than a valence of a metal ion constituting the n-type oxide semiconductor, excluding the dopant.

12. The display element according to claim 11, wherein the light control element contains an electroluminescent element, or an electrochromic element.

13. The display element according to claim 11, wherein the light control element contains a liquid crystal element, or an electrophoretic element.

14. An image display device, which displays an image corresponding to image data, comprising:
a plurality of display elements arranged in a matrix;
a plurality of lines configured to separately apply gate voltage to field-effect transistors in each of the display elements; and
a display control device configured to individually control the gate voltage of each of the field-effect transistors through the lines corresponding to the image data,
wherein the display element contains:
a light control element configured to control light output according to a driving signal; and
a driving circuit, which contains the field-effect transistor, and is configured to drive the light control element,
wherein the field-effect transistor contains:
a gate electrode configured to apply gate voltage;
a source electrode and a drain electrode, which are configured to extract electric current;
an active layer formed of a n-type oxide semiconductor, provided in contact with the source electrode and the drain electrode; and
a gate insulating layer provided between the gate electrode and the active layer,
wherein the n-type oxide semiconductor is a triclinic crystal compound, a monoclinic crystal compound, or a trigonal crystal compound, each of which is substitutionally doped with at least one dopant selected from the group consisting of a divalent cation, a trivalent cation, a tetravalent cation, a pentavalent cation, and a hexavalent cation, and
wherein a valence of the dopant is larger than a valence of a metal ion constituting the n-type oxide semiconductor, excluding the dopant.

15. A system, comprising:
an image display device; and
an image date generating device, configured to generate an image data based on image information to be displayed, and to output the generated image data to the image display device,
wherein the image display device is an image display device configured to display an image according to the image data,
wherein the image display device contains:
a plurality of display elements arranged in a matrix;
a plurality of lines configured to separately apply gate voltage to field-effect transistors in each of the display elements; and
a display control device configured to individually control the gate voltage of each of the field-effect transistors through the lines corresponding to the image data,
wherein the display element contains:
a light control element configured to control light output according to a driving signal; and
a driving circuit, which contains the field-effect transistor, and is configured to drive the light control element,
wherein the field-effect transistor contains:
a gate electrode configured to apply gate voltage;
a source electrode and a drain electrode, which are configured to extract electric current;
an active layer formed of a n-type oxide semiconductor, provided in contact with the source electrode and the drain electrode; and
a gate insulating layer provided between the gate electrode and the active layer,
wherein the n-type oxide semiconductor is a triclinic crystal compound, a monoclinic crystal compound, or a trigonal crystal compound, each of which is substitutionally doped with at least one dopant selected from the group consisting of a divalent cation, a trivalent cation, a tetravalent cation, a pentavalent cation, and a hexavalent cation, and
wherein a valence of the dopant is larger than a valence of a metal ion constituting the n-type oxide semiconductor, excluding the dopant.

* * * * *